United States Patent [19]

Barkley et al.

[11] Patent Number: 5,172,979
[45] Date of Patent: Dec. 22, 1992

[54] HEATER TUBE SKIN THERMOCOUPLE

[75] Inventors: Rich W. Barkley, Houston; Ken C. Leung, Sugarland; Jordan Loftus, Houston, all of Tex.

[73] Assignee: Texaco Inc., White Plains, N.Y.

[21] Appl. No.: 800,319

[22] Filed: Nov. 29, 1991

[51] Int. Cl.$^5$ .............................. H01L 35/00; G01K 1/14
[52] U.S. Cl. .................................. 374/147; 374/179; 374/208
[58] Field of Search ..................... 374/147, 179, 208

[56] References Cited

U.S. PATENT DOCUMENTS

| | | | |
|---|---|---|---|
| 2,142,677 | 1/1939 | Parker | 374/208 X |
| 3,015,234 | 2/1962 | Springfield | |
| 3,143,439 | 8/1964 | Hansen | 374/208 X |
| 3,263,502 | 1/1964 | Springfield | |
| 3,874,239 | 4/1975 | Finney | 374/147 |
| 3,901,080 | 8/1975 | Hilborn | 374/179 X |
| 3,907,606 | 9/1975 | Chang | 374/208 X |
| 4,625,200 | 11/1986 | Hilborn | |

FOREIGN PATENT DOCUMENTS

| | | | |
|---|---|---|---|
| 1040351 | 9/1983 | U.S.S.R. | 374/147 |
| 2062860 | 5/1981 | United Kingdom | 374/147 |

Primary Examiner—Daniel M. Yasich
Attorney, Agent, or Firm—Jack H. Park; Kenneth R. Priem; Russell J. Egan

[57] ABSTRACT

A skin thermocouple assembly is formed by a mounting block profiled to be mounted on the device to be monitored and to receive an end of the thermocouple therein. A heat shield is received over the block to prevent it from becoming a fin for heat exchange causing an error in the reading of the thermocouple.

10 Claims, 2 Drawing Sheets

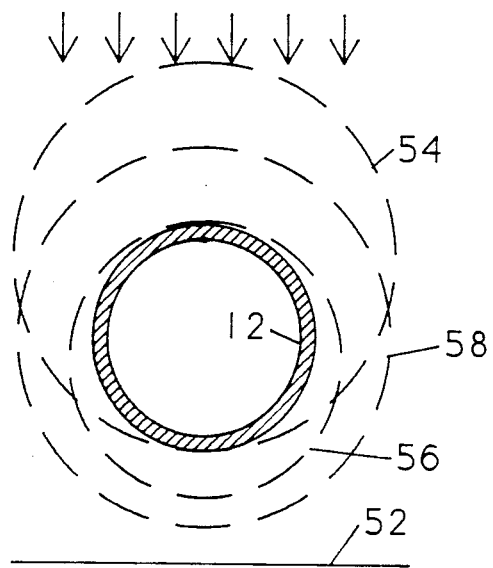 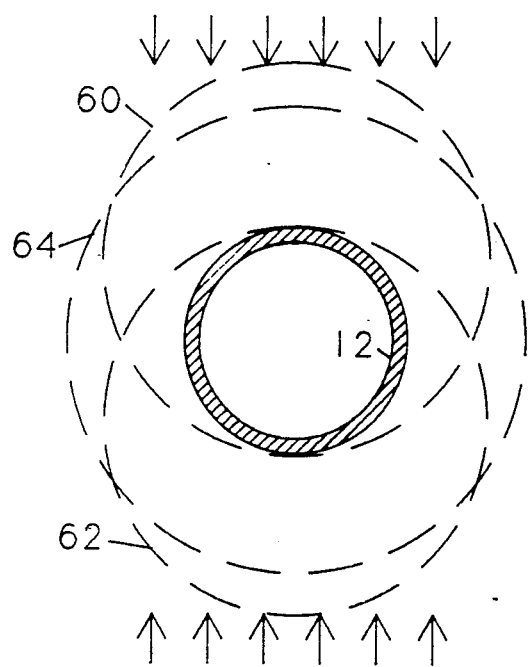
FIG. 4
FIG. 5

HEATER TUBE SKIN THERMOCOUPLE

BACKGROUND OF THE INVENTION

1. The Field of the Invention

The present invention relates to a skin thermocouple and in particular to a thermocouple providing improved diagnostic information on the operation of a heater.

2. The Prior Art

The basic purpose of a skin thermocouple is to protect a tube from overheating. An accurate skin thermocouple will also provide diagnostic information on the operation of the heater in which the tube is incorporated. All heaters which are susceptible to coke formation around the tubes should be provided with skin thermocouples. These types of heaters include all refinery heaters processing crude and heavier feed stocks. Also, heaters operating with tube wall temperatures near the maximum permissible temperature of the tube should be equipped with skin thermocouples.

The skin thermocouple is preferably located at the point of highest temperature on the tube for the obvious reason that this is the point where damage is most likely to occur. A good skin thermocouple must not only measure the temperature of the tube metal accurately, but also have a life span which is substantially equal to the turnaround time of the units, which time is usually in excess of two years.

The prior art is represented by U.S. Pat. No. 3,015,234 to Springfield; U.S. Pat. No. 3,263,502 to Springfield; U.S. Pat. No. 3,901,080 to Hilborn; and U.S. Pat. No. 4,625,200 to Hilborn. The first Springfield reference shows means for mounting a bimetallic heat sensing member in a heater chamber, such as a pressure vessel. The second Springfield reference concerns means for mounting multiple thermocouples into a device to be temperature measured. The first Hilborn reference considers the problems of mounting a skin temperature measuring device on a curved surface and includes a shield to protect the thermocouple junction. The second Hilborn reference relates to positioning a thermocouple cable in such a manner as to detect hot spots within an area to be measured. None of these references addresses the specific problem solved by the present invention.

SUMMARY OF THE INVENTION

The subject skin thermocouple assembly forms a metal path along the tube wall without any gaps and/or scale resistance. A thermocouple mounting block is welded to the hottest location on the tube which normally is the side closest to the flame or hot gas cavity and the leads take the shortest route away from this area. An outer radiation shield is provided over the thermocouple junction to prevent the block from being subject to direct radiation which would adversely affect temperature measurement by the thermocouple. A insulation pad is placed between the outer shield and the mounting block so that outer shield does not act as a fin to radiate heat to or from the thermocouple. The thermocouple leads are insulated and shielded in the hottest zone of the tube.

BRIEF DESCRIPTION OF THE DRAWINGS

FIG. 4 is a diagrammatic view showing distribution from single side firing; and

FIG. 5 is a diagrammatic view showing flux distribution from double side firing.

DETAILED DESCRIPTION OF THE PRESENT INVENTION

Figure 1:
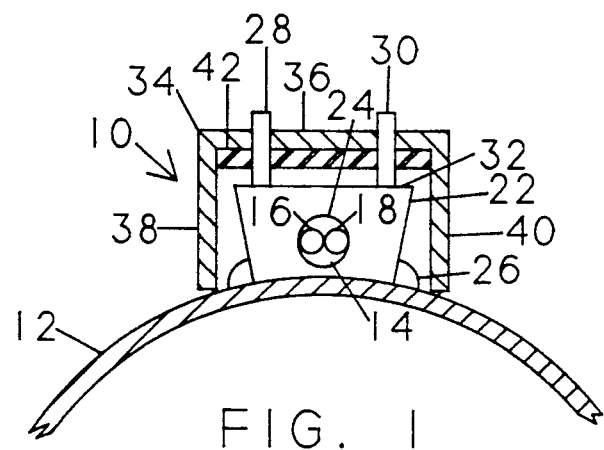
FIG. 1 is a partial transverse section through a tube coil with the subject invention mounted thereon.
Figure 2:
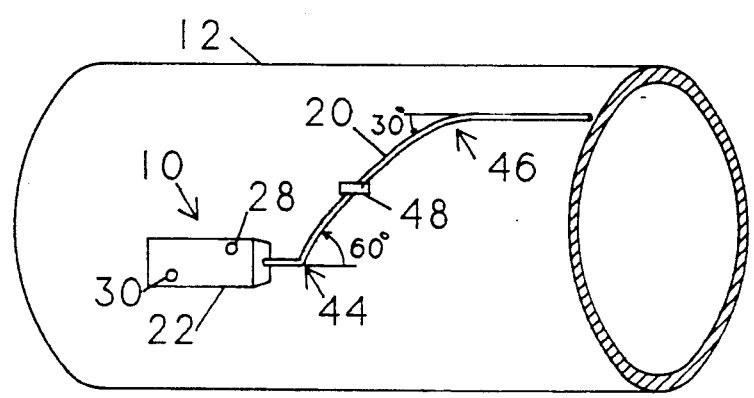
FIG. 2 is a perspective view of a section of tube coil with the subject invention mounted thereon with the covers removed.
Figure 3:
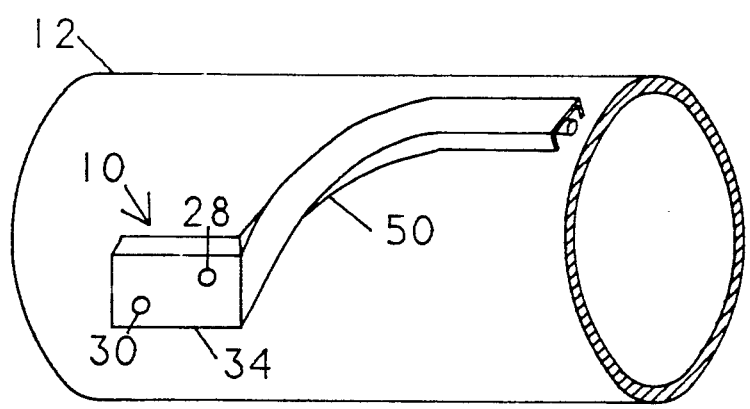
FIG. 3 is a view similar to FIG. 2 showing the present invention with the covers in place.

The subject skin thermocouple assembly 10 is shown mounted on a heater tube 12. The skin thermocouple assembly 10 includes a known thermocouple 14 which has a pair of elongated members 16,18 encased within a sheath lead 20. One free end of the thermocouple 14 is mounted in a block 22, here shown with a trapezoidal section for reasons which will be described later. A bore 24 passes through the block 22 adjacent one surface thereof, which surface is welded to the tube 12 at 26. The mounting block 22 has a pair of studs 28,30 projecting from the outer surface 32 thereof. The heat shield 34 (FIGS. 1 and 3) is profiled to enclose the block 20 and a portion of the lead 20. The heatshield 34 has a top wall 36 with depending side walls 38,40 and an end wall (not shown) and encloses a layer of insulation 42. The thermocouple lead 20 is profiled with a first bend at 44, then is bent in an arc to follow the curvature of the tube until it reaches a point away from the hot zone where a second bend 46 directs the lead longitudinally along the tube. The reason for this configuration is that the thermocouple is mounted on the tube at the point of highest temperature, but it is desired that the thermocouple lead not be exposed to this temperature for its entire length. Therefore, the thermocouple lead is bent to get it out of the high temperature are to a shaded side of the tube where it will be less affected by the heat being applied to the tube.

A standard high quality sheath thermocouple 14 is passed through the bore 24 in the thermocouple block 22 such that its measuring head or free end extends within the short distance from the front edge of the block 22. It is preferably shop-welded to the block 22 and the bottom of the block is ground to match the curved surface of the tube 12. The marginal edges of the block 22 are welded along the longitudinal axis of the tube 12 at 26 to minimize gaping. Studs 28,30 are shop-fastened to the back of the block 22 to receive the heat shield 34 thereon.

The thermocouple lead 20, after an initial short straight run, is bent 30° at 44 and, at a point of inflection, a second bend 46 is made. Where the tubes 12 are adjacent heater walls, the second bend is 60° to direct the sheathed lead towards the wall. For double firing tubes away from the walls, and burners firing on both sides of the coil, the second bend is a reversed 30° which places the lead into a cool zone. The lead is held in place against the tube by welding on clips 48 at spaced intervals.

Single side firing is a condition where the tube coil is located adjacent to the furnace wall. FIG. 4 shows the theoretical flux profile around a single heater tube 12 adjacent to a wall 52 of a radiant chamber (none of these known items being shown) having an adjacent tube on each side. There are two flux profiles, the incident flux 54 and the reflective flux 56. The former is a result of direct radiation from flame-hot gas cavity in the front of the tube and the latter is re-radiated from the near adiabatic refractory wall (not shown) to the backside of the tube. There is some overlapping of these flux fields.

The magnitude of each flux field and their combined magnitude is proportional to the distance to the envelope edge minus the outside diameter of the tube. The average flux 58 is illustrated by the dashed circle in the figure. The vicinity of the leading edge of the flux profile is relatively flat whereas it rapidly decreases from approximately the 2 o'clock point onwards. This is due to shading by the adjacent tube. The hottest location is at the 12 o'clock point and fixes the location of the thermocouple junction. At the 3 or 9 o'clock point the flux is 40% of the peak flux.

Double side firing is the condition where the tube coil is spaced from the furnace walls and burners are located on both sides of the coil. An analysis of FIG. 5 shows the double fired tube with incident flux 60 and 62 and average flux 64. It will be noted that at 90° the flux is 61% of the peak flux and is the coolest surface on the tube. An important objective of this invention is to protect the skin thermocouple leads from exposure to radiation from flame and hot gases until they reach this cool section of the tube where they are protected by adjacent tube shading.

The heat shield 34 over block 22 used with the present invention is insulated on the inside and does not touch the subject thermal coil nor is it welded to the tube surface. The heat shield 50 is filled with an insulation material and is also provided to cover a portion of the thermocouple lead. Notches are cut in the shield 50 to allow it to be configured to the tube. It is fastened to the tube surface by tack-welds between the notches. The space between the notches is also provided for clearance for relative movement between the tube and the shield.

The skin thermocouple junction is located at the highest temperature point on the circumference of the tube. There is no heat leak due to a circumferential component of conductive heat transfer through the thermal block. The insulated thermocouple shield completely shades the block from direct radiant heat transfer from the flame or hot gases within the hot cavity and indirectly by re-radiating from the hot inner surface of the shield. The shield is not welded to the tube and thus it will not act as a fin which would result in other than true temperature readings. The insulated lead cover protects the leads from reaching the temperature of the hot combustion gasses, which is a common cause of failure of thermocouples. The use of the 30° and 60° bends, rather than 90° bends, further reduces the stress created on the thermocouple leads. Such stresses promote the formation of large grain structure and also are a common cause of short thermocouple life.

The present invention may be subject to many modifications and changes without departing from the spirit or essential characteristics thereof. The present embodiment is therefore to be considered in all respects as illustrative and not restrictive of the scope of the invention.

We claim:
1. A skin thermocouple assembly to provide diagnostic information on the operation of heater means, such as heat pipes of a furnace, said thermocouple assembly comprising:
   a thermocouple member having a pair of elongated thermosensitive elements contained within an elongated sheathing;
   a thermocouple block having a through bore receiving therein one end of said thermocouple member;
   means to secure said block to a curved surface to be monitored;
   thermocouple heat shield means defining a cavity receiving said block therein, said heat shield means having a layer of insulation abutting said block to prevent the heat from adjacent heat pipes from affecting the operation of said thermocouple member;
   means for mounting said shield on said block; and an elongated thermocouple lead radiant shield.
2. A skin thermocouple assembly according to claim 1 wherein said block has a mounting surface profiled to closely engage a surface of the heater means to be monitored.
3. A skin thermocouple assembly according to claim 1 wherein said means for mounting said shield on said block comprise at least one stud extending from said block and to which said shield is secured.
4. A skin thermocouple assembly according to claim 1 wherein said block is secured to said surface to be monitored by welding.
5. A skin thermocouple assembly according to claim 1 wherein said elongated thermocouple heat shield is notched to allow it to be profiled to conform to the surface to be monitored.
6. A skin thermocouple assembly according to claim 1 further comprising means to mount said heat shields in such a manner that they neither contact the block, thermocouple nor the heater means.
7. A skin thermocouple assembly according to claim 1 further comprising clip means securing said thermocouple to said heater means.
8. A skin thermocouple assembly according to claim 1 wherein said block is mounted at the point of highest temperature on said surface to be monitored.
9. A skin thermocouple assembly according to claim 8 wherein said thermocouple includes leads profiled to extend from said block to the area of least heat on the surface to be monitored along the least stressed path.
10. A skin thermocouple assembly according to claim 9 wherein said thermocouple leads execute an 60° turn adjacent the block and a 30° turn remote from said block to extend the length of a heater tube.

* * * * *